(12) United States Patent
Wan et al.

(10) Patent No.: US 7,900,099 B2
(45) Date of Patent: Mar. 1, 2011

(54) ENABLING TEST MODES OF INDIVIDUAL INTEGRATED CIRCUIT DEVICES OUT OF A PLURALITY OF INTEGRATED CIRCUIT DEVICES

(75) Inventors: Judy Wan, Mountain View, CA (US); Benjamin Louie, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 996 days.

(21) Appl. No.: 11/043,011

(22) Filed: Jan. 25, 2005

(65) Prior Publication Data

US 2006/0164894 A1 Jul. 27, 2006

(51) Int. Cl.
G11C 29/00 (2006.01)
G01R 31/28 (2006.01)
G01R 31/26 (2006.01)

(52) U.S. Cl. .............. 714/718; 714/724; 365/201; 324/765

(58) Field of Classification Search .......... None
See application file for complete search history.

(56) References Cited

U.S. PATENT DOCUMENTS

| | | | |
|---|---|---|---|
| 5,325,368 A * | 6/1994 | James et al. ........... | 714/727 |
| 5,423,050 A * | 6/1995 | Taylor et al. ........... | 714/31 |
| 5,526,311 A | 6/1996 | Kreifels | |
| 5,548,596 A * | 8/1996 | Tobita ................ | 714/719 |
| 5,617,531 A * | 4/1997 | Crouch et al. .......... | 714/30 |
| 5,748,939 A | 5/1998 | Rozman | |
| 7,093,176 B2 * | 8/2006 | Nicolaidis et al. ...... | 714/733 |
| 7,178,076 B1 * | 2/2007 | Zarrineh et al. ........ | 714/733 |
| 7,260,759 B1 * | 8/2007 | Zarrineh et al. ........ | 714/733 |
| 7,315,969 B2 * | 1/2008 | Jakobs ................ | 714/718 |
| 7,389,458 B2 * | 6/2008 | Bacigalupo ............ | 714/733 |
| 2003/0163773 A1 * | 8/2003 | O'Brien et al. ......... | 714/726 |
| 2004/0006729 A1 * | 1/2004 | Pendurkar ............. | 714/733 |
| 2004/0049724 A1 * | 3/2004 | Bill et al. ............ | 714/733 |
| 2004/0199843 A1 * | 10/2004 | Hansquine et al. ...... | 714/733 |
| 2006/0053355 A1 * | 3/2006 | Ozaki ................. | 714/724 |
| 2006/0107160 A1 * | 5/2006 | Ricchetti et al. ....... | 714/742 |

* cited by examiner

*Primary Examiner*—John P Trimmings
*Assistant Examiner*—Guerrier Merant
(74) *Attorney, Agent, or Firm*—Leffert Jay & Polglaze, P.A.

(57) ABSTRACT

Methods and apparatus are provided. A common test-mode enable signal is received at two or more integrated circuit devices of an electronic system. A test mode of only an integrated circuit device of the two or more integrated circuit devices that was last to receive a valid command is enabled in response to the common test-mode enable signal.

26 Claims, 5 Drawing Sheets

ENABLING TEST MODES OF INDIVIDUAL INTEGRATED CIRCUIT DEVICES OUT OF A PLURALITY OF INTEGRATED CIRCUIT DEVICES

TECHNICAL FIELD OF THE INVENTION

The present invention relates generally to integrated circuit devices and in particular the present invention relates to enabling test modes of individual integrated circuit devices out of a plurality of integrated circuit devices.

BACKGROUND OF THE INVENTION

Multi-die memory boards or packages contain a number of individual memory devices, e.g., that may be stacked one above another. Each memory device may be a NAND or a NOR flash memory device, dynamic random access memory (DRAM) device, static random access memory (SRAM) device, or the like. Usually, each memory device receives commands from a processor over the same control bus. This usually works fine when the memory devices receive common commands. However, problems arise when a command is intended for less than all of the memory devices. For example, it may be desired to test one memory device at a time by placing that memory device into a test mode by issuing a test-mode enable command. If all of the memory devices receive the test-mode enable command, their responses to the test-mode enable command contend with each other.

For the reasons stated above, and for other reasons stated below which will become apparent to those skilled in the art upon reading and understanding the present specification, there is a need in the art for alternatives for enabling a test mode of an individual memory device out of a plurality of memory devices of a memory package.

SUMMARY

The above-mentioned problems with enabling a test mode of an individual memory device out of a plurality of memory devices of a memory package and other problems are addressed by the present invention and will be understood by reading and studying the following specification.

For one embodiment, the invention provides a method of operating an electronic system that includes receiving a first command, determining whether a prior command is valid, and responding to the first command only if it is determined that the prior command is valid.

For another embodiment, the invention provides a method of selecting a memory device from a plurality of memory devices for testing. The method includes issuing a common command to the plurality of memory devices, where it is known for which one of the memory devices the command is intended. Issuing a common test-mode enable signal to the plurality of memory devices is included in the method, as is enabling a test mode of the one memory device for which the command was intended in response to the common test-mode enable signal.

For another embodiment, the invention provides an electronic system having a processor, two or more integrated circuit devices, and a bus coupled to the two or more integrated circuit devices and to the processor. Each of the integrated circuit devices is adapted to enter a test mode in response to an enable signal only upon determination that a prior command from the processor was valid.

Further embodiments of the invention include methods and apparatus of varying scope.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
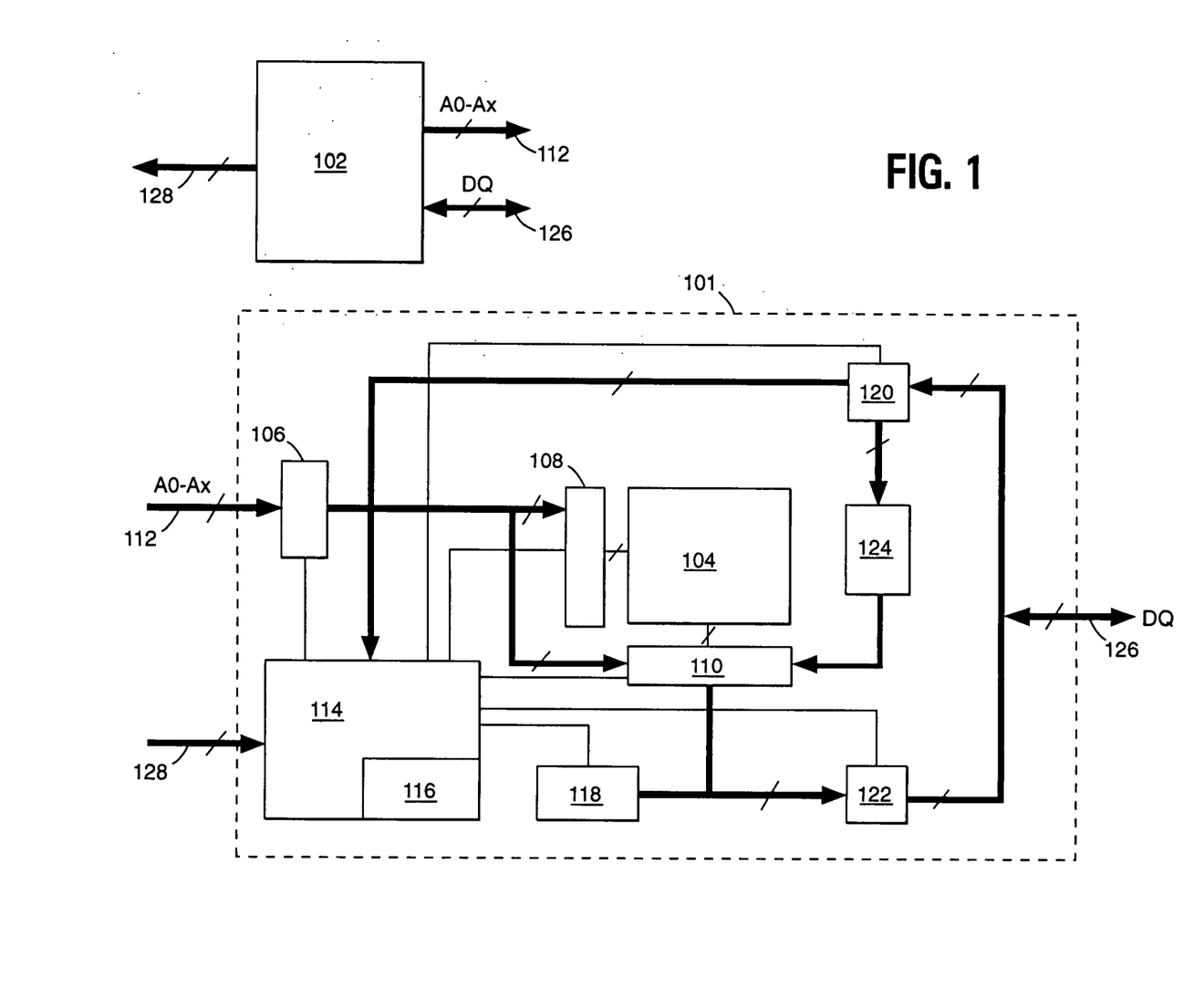
FIG. 1 is a block diagram illustration of an integrated circuit device, according to an embodiment of the invention.
Figure 2:
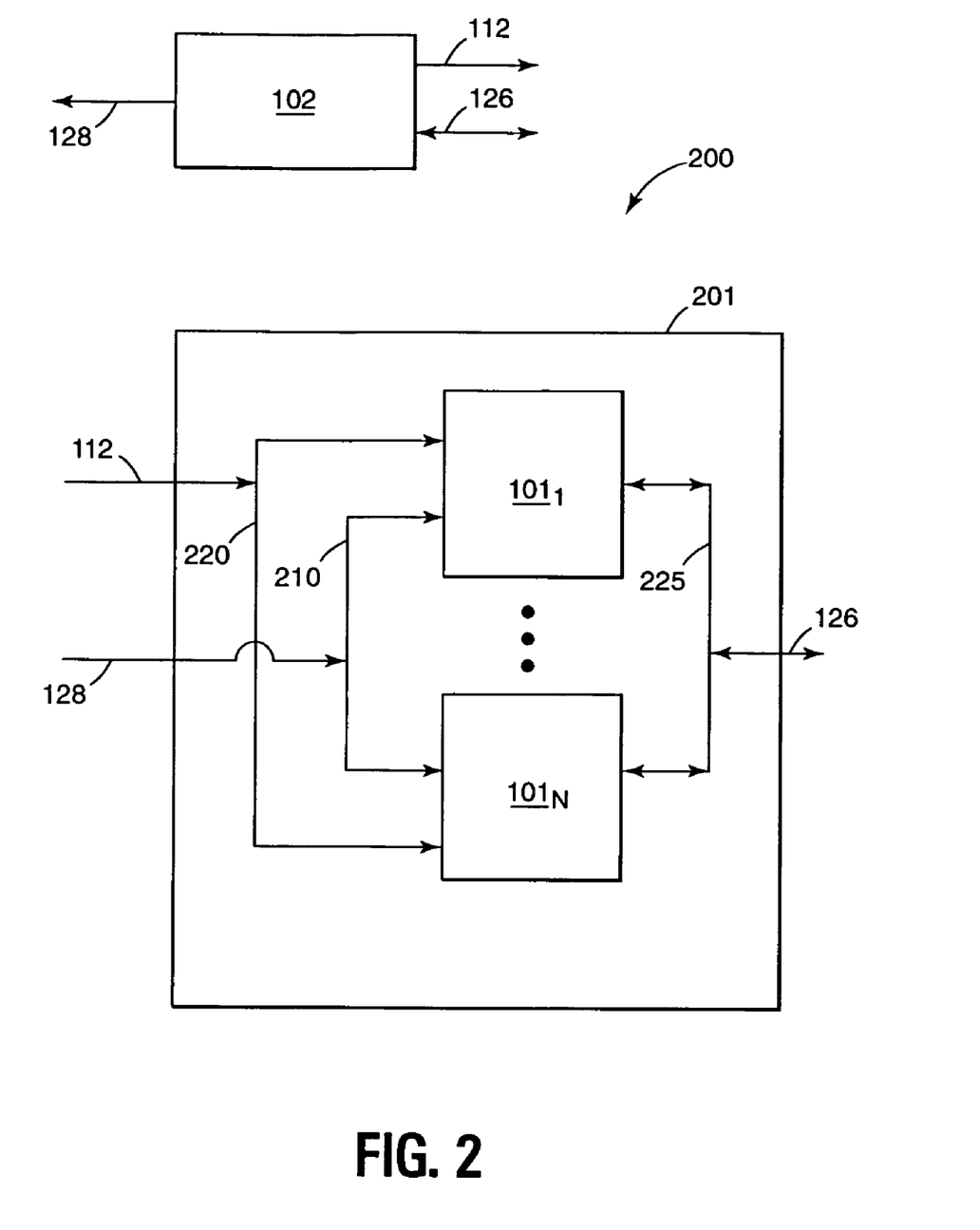
FIG. 2 a block diagram illustration of an electronic system, according to another embodiment of the invention.

FIG. 1 is a block diagram illustration of an integrated circuit device, such as a processor, a memory device 101, etc., according to an embodiment of the invention. The memory device 101 may be fabricated as semiconductor device on a semiconductor die of a semiconductor wafer. Examples of memory devices include NAND or NOR flash memory devices, dynamic random access memory devices (DRAMs), static random access memory devices (SRAMs), or the like. FIG. 1 further shows that the memory device 101 may be coupled to a processor 102 to form part of an electronic system. Regardless of whether the memory device 101 is an active component of an electronic system or a device under test in the electronic system, processor 102 may be coupled to more than one memory device 101 of a multi-die memory board (or package) 201, as illustrated in FIG. 2, according to another embodiment of the invention, to form part of an electronic system 200. Examples of electronic systems include such systems as computer systems, peripheral devices, cellular and wireless devices, digital cameras, audio recorders, personal digital assistants (PDAs) and test equipment.

As shown in FIG. 2, a common control signal bus 210 is coupled to each of memory devices 101, as are a common address bus 220 and a common data bus 225. Processor 102 provides address signals, data signals and control signals to each of memory devices 101 via address bus 220, data bus 225, and control signal bus 210 through address lines 112, data (DQ) lines 126 and control lines 128, respectively. For another embodiment, the address signals, data signals, and control signals are respectively provided to each of memory devices 101 on a single shared bus by switching the respective signals onto the shared bus.

Referring to FIG. 1, each memory device 101 includes a memory array 104 having memory cells arranged in rows and columns. The memory cells (not shown) of the memory array 104 may be non-volatile floating-gate memory cells, such as in a flash memory device. Row access circuitry 108 and column access circuitry 110 are provided to decode address signals provided on the address lines A0-Ax 112 and to provide access to the memory cells of the memory array 104 in response to the decoded address signals. An address control circuit 106 is provided to latch the externally applied address signals prior to decoding. Data input 120 and output 122 buffer/driver circuits are included for bi-directional data communication over the data (DQ) 126 with the processor 102. A data latch 124 is typically provided between input buffer/driver circuit 120 and the memory array 104 for storing data values (to be written to a memory cell) received from the DQ lines 126.

Command control circuit 114 decodes control signals provided on the control lines 128 from the processor 102. These control signals are used to control the operations on the memory array 104, including data read, data write, and erase operations. Command control circuit 114 is adapted to facilitate the methods of the various embodiments. A test mode logic circuit 116 is included in each memory device 101 and may be a part of the command control circuit 114.

For one embodiment, a status register/logic 118 provides the one or more status bits indicative of the status of each memory device 101. Each memory device 101 has been simplified to facilitate a basic understanding of the features of the memory. A more detailed understanding of typical memory devices is known to those skilled in the art.

During erase or write operations on a memory device of the type described above, a processor issues a command or command sequence to initiate the operation. The processor then polls the status register/logic for completion of the operation. If the memory device fails the operation, it may continue to return back a fail status indefinitely upon accessing subsequent location addresses. In such situations, it may be desirable to disable the memory device to preclude further testing.

Figure 3:
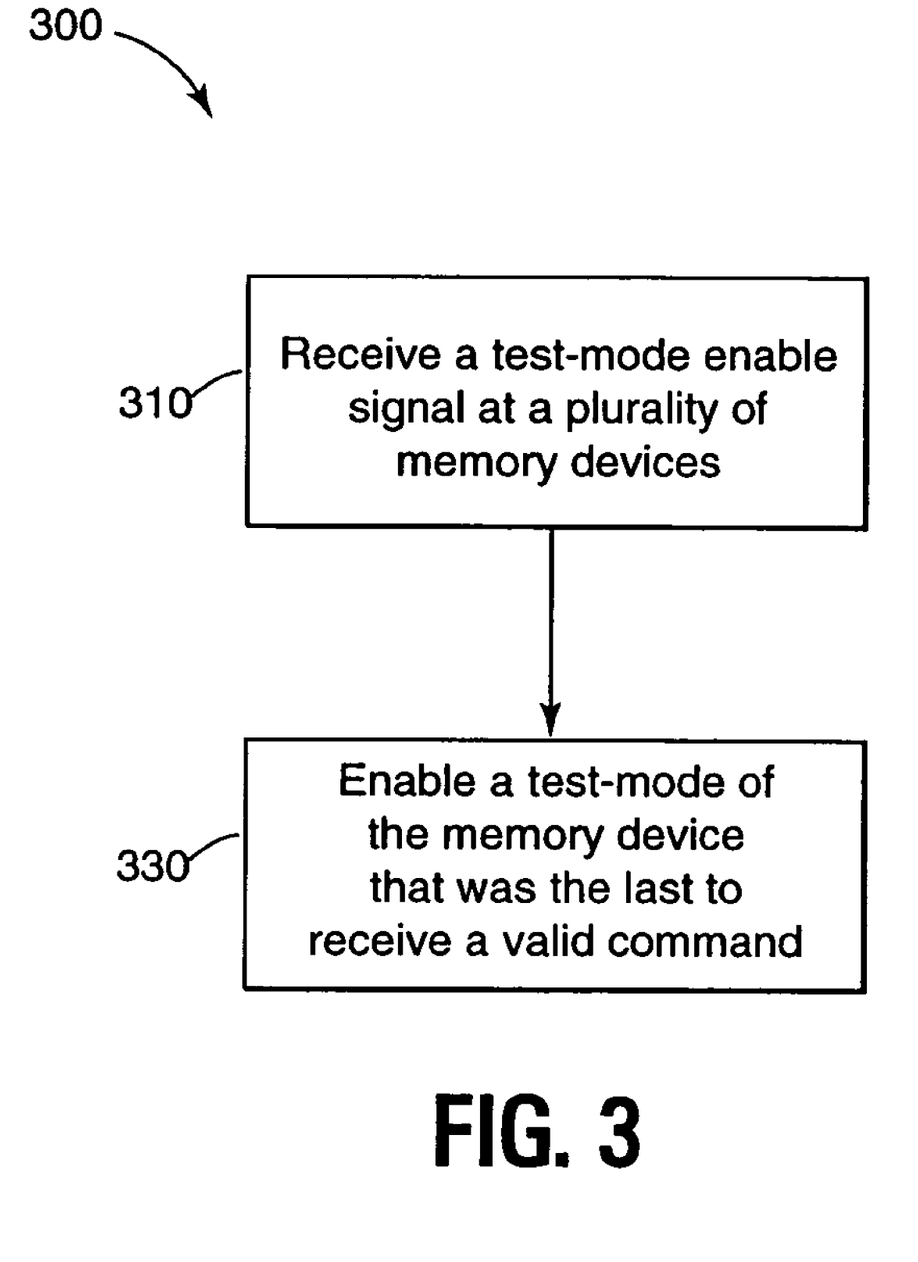
FIG. 3 is a flowchart of a method of enabling a test mode of a single integrated circuit device out of a plurality of integrated circuit devices, according to an embodiment of the invention.

Each test mode logic circuit 116 is adapted to enable a test mode and to control testing functions internal to the respective memory device during the test mode in response to a pattern, sequence, or potential level of one or more of the control signals (hereinafter called a test-mode enable signal). FIG. 3 is a flowchart of a method 300 of enabling a test mode of a single integrated circuit device, such as a memory device 101, out of a plurality of integrated circuit devices, according to an embodiment of the invention. For one embodiment, a common test-mode enable signal is received at the command control circuit 114 of each of memory devices 101 substantially simultaneously at block 310 via common control signal bus 210. For another embodiment, the test-mode enable signal may be received via common address bus 220 and the address lines 112 coupled thereto. At block 330, a test mode of the memory device 101 that was last to receive a valid command is enabled by its test mode logic circuit 116, but not the other memory devices.

Specifically, each memory device 101 receives common commands having addresses, e.g., write commands, read commands, dummy commands, etc. However, only one of the memory devices 101 will include an address that matches the address of one of the common commands. Therefore, to receive a valid command is to include an address that matches the address of a common command. Note that the remaining memory devices 101 will also receive the command, but the command is invalid at these memory devices 101 because they do not include the address that matches the address of the common command.

Each memory device 101 also receives common commands that are not associated with an address, such a status request. However, for commands not associated with an address, the memory devices often need to know which device is intended. For example, if a host issues a status request, the status request would need to be unique for each memory device in order to know which memory device is responding with its status. This is often accomplished by setting registers within the memory device to designate what unique pattern, sequence, and/or potential level of one or more signals correspond to that memory device's command. The memory device 101 for which the command is intended is said to have received a valid command.

When a subsequent test-mode enable signal is received at the command control circuit 114 of each of memory devices 101, the command control circuit 114 of the one memory device 101 receiving the valid command is the last to receive a valid command because the remaining memory devices did not receive valid commands, so the command control circuit 114 of that memory device 101 will cause its test mode logic circuit 116 to enable the test mode of that memory device 101. The command control circuits 114 of the remaining memory devices 101 receiving the invalid command will ignore the test-mode enable signal because their prior command was invalid.

Figure 4:
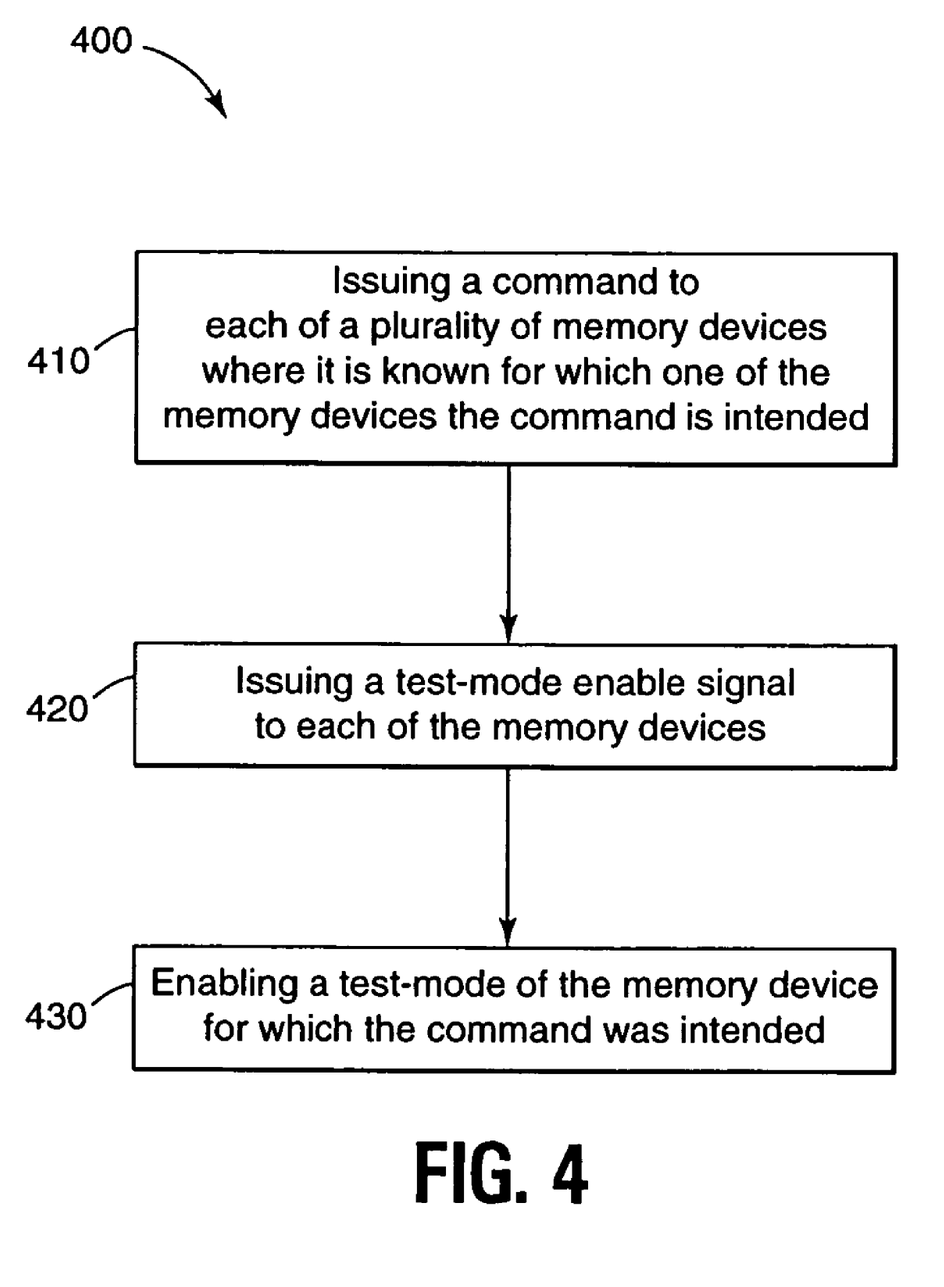
FIG. 4 is a flowchart of a method for selectively enabling a test mode of an integrated circuit device, according to another embodiment of the invention.

FIG. 4 is a flowchart of a method for selectively enabling a test mode of an integrated circuit device, such as a memory device 101, according to another embodiment of the invention. A common command is issued to each of the memory devices 101 at block 410. It is known for which one of the memory devices 101 the command is intended in that the intended memory device is known to have an address that matches the address of the command or is known to be responsive to the command. A common test-mode enable signal is issued to each of the memory devices 101 at block 420. At block 430, the test mode of the memory device 101 for which the command was intended is enabled. Note that the memory device 101 having the address that was known to match the address of the command or that was known to be responsive to the command is forced to be the last memory device that received a valid command.

Figure 5:
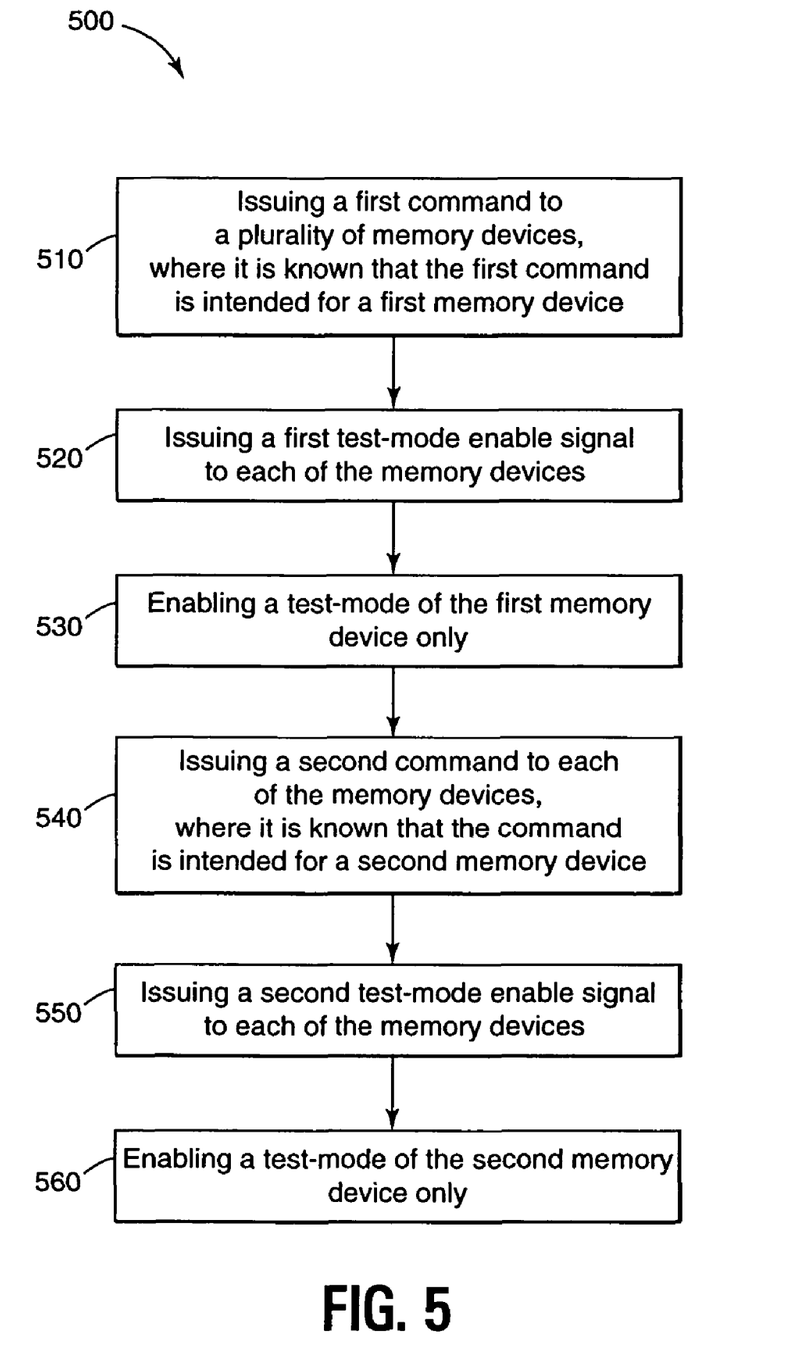
FIG. 5 is a flowchart of a method for selectively enabling test modes of more than one integrated circuit device, according to another embodiment of the invention

FIG. 5 is a flowchart of a method for selectively enabling test modes of more than one integrated circuit device, according to another embodiment of the invention. A first command is issued to each of the memory devices 101 at block 510. It is known that the first command is intended for a first memory device of the memory devices 101 in that the first memory device is known to have an address that matches the address of the first command or is known to be responsive to the first command. A first test-mode enable signal is issued to each of the memory devices 101 at block 520. At block 530, the test mode of only the first memory device is enabled, causing one or more first tests to be performed on the first memory device in response to the first test-mode enable signal.

A second command is issued to each of the memory devices 101 at block 540. It is known that the second command is intended for a second memory device of the memory devices 101 in that the second memory device is known to have an address that matches the address of the second command or is known to be responsive to the second command. For one embodiment, the second command is sent while first memory device is busy, e.g., while the one or more first tests are being performed on the first memory device, and the first memory device ignores the command, e.g., because it is busy. A second test-mode enable signal is issued to each of the memory devices 101 at block 550. At block 560, the test mode of only the second memory device is enabled, causing one or more second tests to be performed on the second memory device in response to the second test-mode enable signal. The one or more second tests may be the same as or different than the one or more first tests being performed on the first memory device. For other embodiments, the method may be repeated for placing other memory devices into test mode. For some embodiments, this may be done while the first and second memory devices are being tested.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating an electronic system, comprising:
   receiving a first command at two or more integrated circuit devices of the electronic system;
   determining that a common prior command that is received at each of the two or more integrated circuit devices is valid at only one of the two or more integrated circuit devices; and
   responding to the first command with the only one of the two or more integrated circuit devices for which the common prior command is valid;
   wherein the common prior command is received at each of the two or more integrated circuit devices prior to receiving the first command at the two or more integrated circuit devices;
   wherein the common prior command has an address or other identifier that uniquely specifies the only one of the two or more integrated circuit devices for which the common prior command is valid;
   wherein the common prior command initiates an operation on the only one of the two or more integrated circuit devices for which the common prior command is valid; and
   wherein the only one of the two or more integrated circuit devices for which the common prior command is valid responds to the first command in response to determining that the prior command was valid at that one of the two or more integrated circuit devices.

2. The method of claim 1, wherein the first command is a test-mode enable command.

3. The method of claim 1, wherein the common prior command is a read command, a write command, or a status request.

4. A method of operating an electronic system, comprising:
   receiving a common command and an address of the common command at two or more integrated circuit devices of the system;
   determining that only one integrated circuit device of the two or more integrated circuit devices has an address that matches the address of the common command;
   receiving a common test-mode enable signal at the two or more integrated circuit devices; and
   enabling a test mode of the one integrated circuit device determined to have the address that matches the address of the common command in response to determining that that integrated circuit device has the address that matches the address of the common command and in response to the common test-mode enable signal;
   wherein the common test-mode enable signal is received at the two or more integrated circuit devices after the two or more integrated circuit devices receive the common command and the address of the common command; and
   wherein the common command initiates an operation on the one integrated circuit device determined to have the address that matches the address of the common command.

5. The method of claim 4, wherein each of the integrated circuit devices is a memory device.

6. The method of claim 4 further comprises ignoring the common test-mode enable signal at the remainder of the two or more integrated circuit devices.

7. A method of operating an electronic system, comprising:
   issuing a common command having an address to two or more integrated circuit devices of the system;
   determining that only one integrated circuit device of the two or more integrated circuit devices has an address that matches the address of the common command;
   issuing a common test-mode enable signal to the two or more integrated circuit devices after issuing the common command and the address of the common command to the two or more integrated circuit devices; and
   enabling a test mode of the one integrated circuit device determined to have the address that matches the address of the common command in response to determining that that integrated circuit device has the address that matches the address of the common command and in response to the common test-mode enable signal;
   wherein the common command initiates an operation on the one integrated circuit device determined to have the address that matches the address of the common command.

8. The method of claim 7 further comprises ignoring the common test-mode enable signal at the remainder of the two or more integrated circuit devices.

9. A method of selecting a memory device from a plurality of memory devices for testing, the method comprising:
   issuing a common command having an address to each of the plurality of memory devices;
   determining that only one memory device of the plurality of memory devices has an address that matches the address of the common command;
   issuing a common test-mode enable signal to each of the plurality of memory devices after issuing the common command to each of the plurality of memory devices; and
   enabling a test mode of the one memory device determined to have the address that matches the address of the common command in response to determining that that memory device has the address that matches the address of the common command and in response to the common test-mode enable signal;
   wherein the common command initiates an operation on the one memory device determined to have the address that matches the address of the common command.

10. The method of claim 9, wherein the memory devices are NAND memory devices.

11. The method of claim 9 further comprises ignoring the common test-mode enable signal at the remainder of the plurality of memory devices.

12. A method of testing at least two memory devices out of two or more memory devices, the method comprising:
   issuing a first common command having a first address to the two or more memory devices, wherein the first address matches an address of only a first memory device of the two or more memory devices, the first common command initiating an operation on the first memory device;
   issuing a first common test-mode enable signal to the two or more memory devices after issuing the first common command to the two or more memory devices;
   enabling a test mode of only the first memory device in response to the first common test-mode enable signal;
   issuing a second common command having a second address to the two or more memory devices, wherein the second address matches an address of only a second memory device of the two or more memory devices, the second common command initiating an operation on the second memory device;

issuing a second common test-mode enable signal to the two or more memory devices after issuing the second common command to the two or more memory devices;

enabling a test mode of only the second memory device in response to the second common test-mode enable signal; and wherein issuing a second common test-mode enable signal to the two or more memory devices occurs while the test mode of the first memory device is enabled.

13. The method of claim 12, wherein the first and second memory devices perform different tests during their test modes.

14. The method of claim 13, wherein the tests performed by the second memory device are performed while the different tests are being performed by the first memory device.

15. An electronic system comprising:
a processor;
two or more integrated circuit devices; and
a bus coupled to the two or more integrated circuit devices and to the processor;
wherein each of the integrated circuit devices is adapted to enable a test mode thereof in response to an enable signal only upon determination that a prior command received at that integrated circuit from the processor was valid;
wherein the prior command is received at that integrated circuit prior to receiving the enable signal at that integrated circuit device;
wherein the prior command is valid when an address thereof matches an address of an integrated circuit device; and
wherein the prior command initiates an operation on an integrated circuit device whose address matches the address of the prior command.

16. The electronic system of claim 15, wherein the bus is a shared bus for respectively providing address signals and control signals to the two or more integrated circuit devices from the processor and conveying data signals between the two or more integrated circuit devices and the processor or comprises a common data bus, common control bus, and a common address bus.

17. The electronic system of claim 15, wherein the enable signal is received over the bus.

18. The electronic system of claim 15, wherein the command and the address thereof are received at each of the two or more integrated circuit devices over the bus.

19. The electronic system of claim 15, wherein each of the two or more integrated circuit devices comprises a memory array having memory cells arranged in rows and columns.

20. The electronic system of claim 19, wherein each of the memory cells is a non-volatile floating-gate memory cell.

21. The electronic system of claim 19, wherein each memory array is a NAND memory array.

22. An electronic system comprising:
a processor;
a bus coupled to the processor; and
two or more memory devices, each coupled to the bus;
wherein each of the two or more memory devices is adapted to:
receive a common command over the bus;
receive an address of the common command over the bus, wherein the common command initiates an operation on the respective memory device when that memory device has an address that matches the address of the common command;
receive a common test-mode enable signal over the bus after receiving the common command and the address of the common command;
enter a test mode, in response to the test-mode enable signal, only when the respective memory device has an address that matches the address of the common command; and
ignore the test-mode enable signal when the respective memory device does not have an address that matches the address of the common command.

23. The electronic system of claim 22, wherein the bus is a shared bus, or the bus comprises a control bus for the common command, an address bus for the address, and a data bus, wherein the common test-mode enable signal is received over the control bus or address bus.

24. The electronic system of claim 22, wherein each of the two or more memory devices comprises a memory array having memory cells arranged in rows and columns.

25. The electronic system of claim 24, wherein each of the memory cells is a non-volatile floating-gate memory cell.

26. An electronic system comprising:
a processor; and
two or more memory devices, each comprising:
a memory array coupled to the processor; and
a command control circuit coupled to the processor and having a test mode logic circuit, the test mode logic circuit adapted to cause the respective memory device to perform a method comprising:
when the respective memory device receives a command and an address of the command, determining whether the address of the command matches an address of the respective memory device, the command and the address of the command also received at the remaining memory devices of the two or more memory devices;
enabling a test mode of the respective memory device in response to determining that the address of the command matches the address of the respective memory device and in response to a test-mode enable signal received at the respective memory device, the test-mode enable signal also received at the remaining memory devices of the two or more memory devices; and
ignoring the test-mode enable signal in response to determining that the address of the command does not match the address of the respective memory device;
wherein the respective memory device receives the command and the address of the command before receiving the test-mode enable signal; and
wherein the command initiates an operation on the respective memory device when it is determined that the address of the command matches the address of the respective memory device.

* * * * *

UNITED STATES PATENT AND TRADEMARK OFFICE
CERTIFICATE OF CORRECTION

| | |
|---|---|
| PATENT NO. | : 7,900,099 B2 |
| APPLICATION NO. | : 11/043011 |
| DATED | : March 1, 2011 |
| INVENTOR(S) | : Judy Wan et al. |

It is certified that error appears in the above-identified patent and that said Letters Patent is hereby corrected as shown below:

In column 5, line 55, in Claim 4, after "that" delete "that".

In column 6, line 16, in Claim 7, after "that" delete "that".

In column 6, line 38, in Claim 9, after "that" delete "that".

Signed and Sealed this
Nineteenth Day of April, 2011

David J. Kappos
*Director of the United States Patent and Trademark Office*